(12) United States Patent
Goldberger

(10) Patent No.: US 7,961,148 B2
(45) Date of Patent: Jun. 14, 2011

(54) HYBRID CIRCUIT WITH AN INTEGRAL ANTENNA

(76) Inventor: Haim Goldberger, Modi'in (IL)

( * ) Notice: Subject to any disclaimer, the term of this patent is extended or adjusted under 35 U.S.C. 154(b) by 860 days.

(21) Appl. No.: 11/693,056

(22) Filed: Mar. 29, 2007

(65) Prior Publication Data

US 2007/0200768 A1    Aug. 30, 2007

(30) Foreign Application Priority Data

Feb. 26, 2006   (IL) .......................................... 173941

(51) Int. Cl.
*H01Q 1/38* (2006.01)

(52) U.S. Cl. ................. 343/700 MS; 343/720; 343/730; 343/906

(58) Field of Classification Search .................. None
See application file for complete search history.

(56) References Cited

U.S. PATENT DOCUMENTS

| | | | |
|---|---|---|---|
| 4,812,855 A * | 3/1989 | Coe et al. ....................... 343/818 |
| 4,924,236 A * | 5/1990 | Schuss et al. .......... 343/700 MS |
| 5,202,752 A | 4/1993 | Honjo |
| 5,300,936 A | 4/1994 | Izadian |
| 5,448,249 A | 9/1995 | Kushihi et al. |
| 5,903,239 A | 5/1999 | Takahashi |
| 6,239,752 B1 * | 5/2001 | Blanchard ..................... 343/702 |
| 6,693,593 B1 | 2/2004 | Burgess |
| 6,828,556 B2 * | 12/2004 | Pobanz et al. ............. 250/336.1 |
| 6,842,144 B2 | 1/2005 | Guo et al. |
| 7,088,964 B2 | 8/2006 | O |
| 7,126,541 B2 | 10/2006 | Mohamadi |
| 7,126,542 B2 | 10/2006 | Mohamadi |
| 7,126,554 B2 | 10/2006 | Mohamadi |
| 2001/0052645 A1 | 12/2001 | Op't Eynde et al. |
| 2003/0122079 A1 * | 7/2003 | Pobanz et al. ......... 343/700 MS |
| 2003/0169207 A1 | 9/2003 | Beigel |
| 2004/0100404 A1 | 5/2004 | Hung |
| 2004/0217472 A1 | 11/2004 | Aisenbrey |
| 2005/0003199 A1 | 1/2005 | Takaya |
| 2005/0167797 A1 | 8/2005 | Bong |
| 2005/0242997 A1 | 11/2005 | Dunn et al. |
| 2005/0285794 A1 * | 12/2005 | Tang et al. .............. 343/700 MS |
| 2006/0017572 A1 | 1/2006 | Kiode |
| 2006/0049995 A1 | 3/2006 | Imaoka et al. |
| 2006/0158378 A1 | 7/2006 | Pons et al. |
| 2006/0202312 A1 * | 9/2006 | Iijima et al. .................... 257/664 |
| 2006/0250298 A1 * | 11/2006 | Nakazawa et al. .............. 342/70 |
| 2006/0256018 A1 | 11/2006 | Castany et al. |

FOREIGN PATENT DOCUMENTS

| | | |
|---|---|---|
| EP | 0-556-941 | 8/1993 |
| WO | WO 2005027260 | 3/2005 |
| WO | WO 2005/041352 | 5/2005 |
| WO | WO 2006019587 | 2/2006 |
| WO | WO 2006051887 | 5/2006 |
| WO | WO 2006078065 | 7/2006 |
| WO | WO 2006028195 | 3/2008 |

\* cited by examiner

*Primary Examiner* — Trinh V Dinh

(57) ABSTRACT

A circuit with an integral antenna, including a hybrid circuit on a substrate, a patch antenna that is adapted to be positioned at a pre-selected distance above the hybrid circuit and coupled to the hybrid circuit to form a single physical unit, a feeder that electronically connects between the hybrid circuit and the patch antenna.

20 Claims, 4 Drawing Sheets

US 7,961,148 B2

HYBRID CIRCUIT WITH AN INTEGRAL ANTENNA

RELATED APPLICATIONS

This application claims priority from Israeli application No. 173941 filed on Feb. 26, 2006, the disclosure of which is incorporated herein by reference.

FIELD OF THE INVENTION

The present invention relates generally to a hybrid circuit with an integral antenna.

BACKGROUND OF THE INVENTION

Nowadays people make use of many electronic devices on a daily basis, for example mobile telephones, GPS navigation systems, radios, MP3 players, PDAs, laptop computers, digital cameras and many other devices. It is a common interest for manufacturers to reduce the size of the circuits controlling the devices since the users are interested in small lightweight devices, which can easily be carried around. Additionally, there is an interest in combining devices together so that a single device can replace multiple devices. Thus a person can carry a single lightweight device, which performs the functions of a plurality of devices that they previously carried around.

In order to miniaturize the devices manufacturers produce hybrid circuits or multi-chip modules which provide the complete functionality of the device in a single chip or miniaturized package. Integration of a full device into a single chip or package is generally advantageous in terms of cost, size, weights power consumption and other factors.

One problem faced by manufacturers is integration of a full wireless system (e.g. Wi-Fi, Bluetooth, mobile telephone) into a single hybrid circuit package. Generally, the manufacturers integrate all circuit elements of the device into a single chip or hybrid circuit encapsulation except the antenna. The antenna is generally excluded because it is subject to size constraints in order to provide satisfactory performance. Additionally, the antenna is subject to interference, from the circuit and to low gain because of the circuit and the packaging.

US patent application publication No. 2006/0256018 to Soler Castany et al. published on Nov. 16, 2006, the disclosure of which is incorporated herein by reference, describes an integrated circuit package including a miniature elongated antenna, which is placed alongside the integrated circuit inside the package.

SUMMARY OF THE INVENTION

An aspect of an embodiment of the invention, relates to a hybrid circuit with an integral antenna packaged encapsulated together. The antenna is provided as a planar patch antenna and is positioned on top of the circuit with a conducting connection between them. In some embodiments of the invention, the connection also serves as a mechanical support for the antenna above the circuit. Alternatively or additionally, other supports are provided on the substrate of the circuit or other methods are used to couple the patch antenna to the circuit and form a single physical unit. In an exemplary embodiment of the invention, the patch antenna includes a conductor plate and a ground plate with a dielectric material between them. Optionally, the ground plate is positioned over the circuit so that the circuit is shielded from the conductor plate and the conductor plate is shielded from the circuit.

In an exemplary embodiment of the invention, the volume between the circuit and the ground plate is filled with a filling material, for example an epoxy resin to form a robust solid unit that can withstand external pressure. Optionally, the patch antenna and the circuit are held together by the filling material after it is cured. In some embodiments of the invention the patch antenna and circuit are surrounded by an encasement and filled with the filling material to form a robust monolithic package. Alternatively, the patch antenna and circuit are placed in a mold, when injecting the filling material and cured to form a solid monolithic package.

In an exemplary embodiment of the invention, the short distance between the circuit and the patch antenna helps to reduce noise and prevent attenuation of the signal received by the antenna.

In some embodiments of the invention, more than one antenna is integrated into the circuit to provide a circuit for multiple functions, for example an antenna for GPS and for GPRS.

There is thus provided according to an exemplary embodiment of the invention, a circuit with an integral antenna, comprising: a hybrid circuit on a substrate; a patch antenna that is adapted to be positioned at a pre-selected distance above the hybrid circuit and coupled to the hybrid circuit to form a single physical unit; a feeder that electronically connects between the hybrid circuit and the patch antenna. Optionally, the footprint of the single physical unit is smaller than 100 mm by 100 mm. In an exemplary embodiment of the invention, the width and length of the footprint of the single physical unit are each at least twice the size of the thickness of the single physical unit.

In an exemplary embodiment of the invention, the volume between the hybrid circuit and the patch antenna is filled with a filling material. Optionally, the filling material can be hardened by a curing process. In an exemplary embodiment of the invention, the filling material couples between the patch antenna and the hybrid circuit. Optionally, the filling material is applied in a mold to form a monolithic package for the single physical unit. In an exemplary embodiment of the invention, the hybrid circuit comprises one or more supports to couple between the hybrid circuit and the patch antenna. Optionally the feeder couples between the hybrid circuit and the patch antenna. In an exemplary embodiment of the invention, the circuit further comprises an encasement that defines the single physical unit. Optionally, the encasement couples between the hybrid circuit and the patch antenna. In an exemplary embodiment of the invention the encasement comprises holes for injecting a filling material between the hybrid circuit and the patch antenna. Optionally, the top of the single physical unit is bound by the patch antenna. In an exemplary embodiment of the invention, the bottom of the single physical unit is bound by the substrate. Optionally, the pre-selected distance is not greater than 1 mm from the tallest element of the hybrid circuit. In an exemplary embodiment of the invention, the patch antenna is adapted to handle GPS signals.

In an exemplary embodiment of the invention, multiple patch antennas are integrated into the circuit. Optionally, two patch antennas are integrated into the circuit. In an exemplary embodiment of the invention, the patch antenna comprises a conducting plate and a ground plate and wherein the conducting plate is formed as a wire frame in a single plane. Optionally, the patch antenna comprises a dielectric layer and a ground plate, and the feeder electronically connects between the dielectric layer to the hybrid circuit. In an exemplary embodiment of the invention, the single physical unit is coated by a protective coating to protect it from environmental factors.

There is additionally provided according to an exemplary embodiment of the invention, a method of creating a hybrid circuit with an integral antenna, comprising: preparing a hybrid electronic circuit on a substrate, preparing a patch antenna for communicating with the hybrid electronic circuit, attaching the patch antenna above the hybrid electronic circuit, filling the volume between the patch antenna and the hybrid electronic circuit with a filling material to form a monolithic packaged hybrid circuit with an integral antenna.

BRIEF DESCRIPTION OF THE DRAWINGS

The present invention will be understood and better appreciated from the following detailed description taken in conjunction with the drawings. Identical structures, elements or parts, which appear in more than one figure, are generally labeled with the same or similar number in all the figures in which they appear, wherein.

DETAILED DESCRIPTION

Figure 1A:
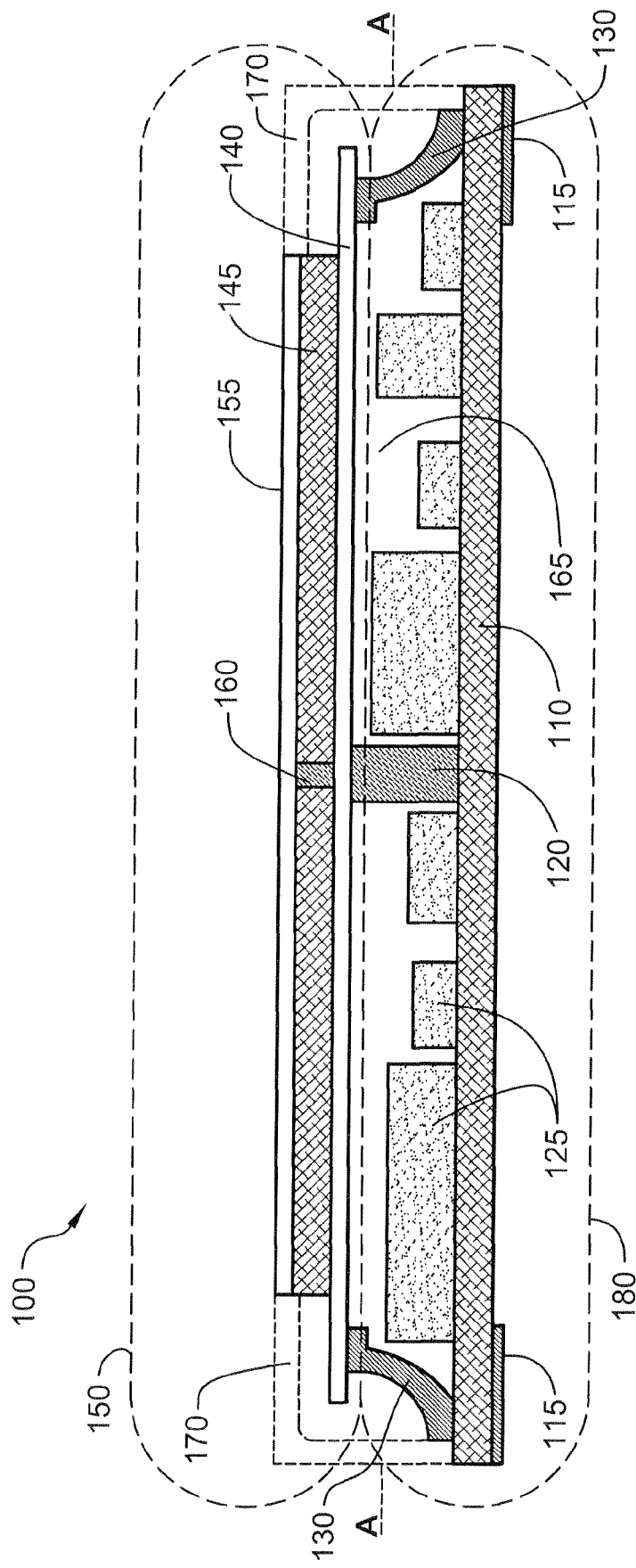
FIG. 1A is a schematic illustration of a cross sectional view of a hybrid circuit with an electronic circuit and an integral patch antenna, according to an exemplary embodiment of the invention.

FIG. 1A is a cross sectional schematic illustration (AA) of a hybrid circuit 100 with an electronic circuit 180 and an integral planar patch antenna 150, according to an exemplary embodiment of the invention. In an exemplary embodiment of the invention, a substrate 110 (e.g. a PCB—printed circuit board) is used as a base for preparing circuit 100. Alternatively, other materials or constructions can be used to serve as the base for circuit 100. In an exemplary embodiment of the invention, various types of circuit elements 125 are used to construct circuit 100, for example circuit elements 125 may include:

1. Passive devices (e.g. resistors, capacitors);
2. Active devices, which require a power source for them to operate (e.g. integrated circuits, transistors), or
3. Other elements, for example discrete elements (e.g. diodes).

Optionally, some elements are embedded in substrate 110, some elements are surface mounted on substrate 110 and some are fitted into holes on substrate 110 and soldered thereon, or connected to substrate 110 according to other methods known in the art. Optionally, substrate 110 may be provided from various materials, for example glass-epoxy, Alumina, Teflon or other types of ceramic, glass ceramics, polymers or provided as a metal lead frame. In an exemplary embodiment of the invention, circuit 100 is provided with one or more contacts 115 for connecting between the module formed by hybrid circuit 100 and other circuits or devices. In some embodiments of the invention, contacts 115 are ball grid array contacts (BGA), land grid array (LGA) or other types of contacts. Optionally, the contacts may be at the corners of the circuit, in the middle or in any other position under substrate 110.

In an exemplary embodiment of the invention, circuit 100 is implemented to provide functionality for a GPS (global positioning system) device, a mobile telephone (e.g. GPRS/GSM) device, a wireless network (Wi-Fi) device or other types of devices, which require communication at frequencies ranging between 0.01 GHz to 100 GHz, for example radio frequency at about 80 MHz, GPS at about 1.5 GHz, WI-FI at about 2.4 GHz and radar at about 70 GHz. In an exemplary embodiment of the invention, patch antenna 150 is mounted as a roof over elements 125 to provide the ability to transmit and receive communications as an integral part of hybrid circuit 100. In an exemplary embodiment of the invention, patch antenna 150 is formed from a conductor plate 155 and a parallel ground plate 140. Optionally, a feed line 160 serves as a conducting connection between conductor patch plate 155 and electronic circuit 180 to handle the signal provided by antenna 150. In an exemplary embodiment of the invention, conductor plate 155 is shaped as a square, a parallelogram, a trapezoid, a quadrilateral, a circle, an ellipse or other planar shapes, including a wire frame located in a single plane. Optionally, ground plate 140 is of a similar shape as conductor plate 155. In an exemplary embodiment of the invention, a dielectric material 145 is placed between the plates in order to allow reduction of the size required for the plates (140,155) depending on the composition of the dielectric material used. In some embodiments of the invention, ground plate 140, conductor plate 155 and dielectric 145 are all of equal size. Alternatively, one layer may be larger than the other layers or all the layers may be different in size, for example ground plate 140 may be larger than dielectric 145 and dielectric 145 may be larger than conductor plate 155 or conductor plate 155 and dielectric 145 may be the same size and ground plate 140 may be larger as shown in FIG. 1. In an exemplary embodiment of the invention, patch antenna 150 may be provided as a dielectric antenna, wherein conductor plate 155 is omitted and dielectric 145 serves as the antenna receptor, or conductor plate 155 is a point of negligible size relative to dielectric 145 or ground plate 140.

Typically, a patch antenna with a vacuum between the plates generally requires conductor plate 155 to have a length of about half the size of the wavelength of the transmission signal used, for example for GPS that uses a frequency of approximately 1.5-1.6 GHz, half a wavelength would be about 95 mmn, which is slightly large for implementing as patch antenna 150 in a hybrid circuit. Optionally, by using dielectric material 145, for example a few layers of high k tape CT765 (manufactured by Heraeus Inc. from PA USA) or low temperature capacitor tapes from series 412XX (manufactured by ESL Electro-Science from PA, USA) or a combination of other dielectric materials, the optimal size can be reduced even tenfold. Thus a size of about 10 mm by 10 mm for patch antenna 150 would suffice to serve as a GPS antenna. The following equation provides a general calculation for determining the required length for a patch antenna based on the dielectric constant: $L = C/2f(\in)^{1/2}$ Wherein L=the patch size length, C=the speed of light, f=the wave frequency under consideration, and $\in$ is the dielectric constant.

In an exemplary embodiment of the invention, the thickness of patch antenna 150 is dependent on the transmission frequency, since the thickness is related to the amount of size reduction required. Optionally, if less size reduction is required a thinner dielectric material would suffice. Additionally, the thickness of patch antenna 150 is also dependent on the materials used, some materials function with thinner plates and a thinner layer of dielectric material 145, for example conductor plate 155 may be provided from a thin (e.g. from 1 micron to 1 mm) plate made from Cu (copper), Au (Gold), Ag (Silver), AgPd (silver palladium) or other metals, and ground plate 140 may also be provided from a thin (e.g. from 1 micron to 1 mm) Cu, Au, Ag or AgPd plate. Likewise, the thickness of the dielectric material may depend on the type of dielectric material used, for example between 0.1 mm to 2 mm or even 5 mm or 10 mm may be required. In some embodiments of the invention, conductor plate 155 and ground plate 140 may be provided as a metal coating on the dielectric material to reduce the thickness of conductor antenna 150 (e.g. with a thickness of 1-100 micron). Optionally, the packaging of hybrid circuit 100 is selected to conform to modular packages available in the field so that it can be readily implemented in other circuits. In an exemplary embodiment of the invention, the size of the footprint of a typical hybrid circuit 100 may vary from about 5 mm×5 mm to about 100 mm×100 mm and the thickness may vary from about 1 mm to about 10 mm. In some embodiments of the invention, hybrid circuit 100 may be packaged with various shaped footprints, for example as a rectangle, trapezoid, circle, ellipse or other shapes. Optionally, the size of patch antenna 150 is designed to be about the same as the size of electronic circuit 180 and vice versa, for example electronic circuit 180 may be enlarged to be about the same size as patch antenna 150 or the size of patch antenna 150 may be enlarged to be about the size of electronic circuit 180. In an exemplary embodiment of the invention, the width and length of the footprint of hybrid circuit 100 are at least twice as long as the thickness of hybrid circuit 100.

Small patch antennas for GPS are available today as stand alone antennas from many manufacturers, for example as manufactured by EMTAC Technology Corp. from Taiwan (www.emtac.com), which produces a 12 mm×12 mm patch antenna for GPS with a thickness of 4 mm.

In an exemplary embodiment of the invention, hybrid circuit 100 is provided with mechanical supports 130 to hold patch antenna 150 at a pre-selected distance above hybrid circuit 100, for example 0.1 mm above the tallest element 125 in hybrid circuit 100. Additionally, hybrid circuit 100 has a connection 120, which provides a signal to patch antenna 150 from electronic circuit 180 and receives signals from patch antenna 150, via feed line 160. Optionally, supports 130 may be conductors to ground the antenna or insulators to isolate it from substrate 110, whereas connection 120 may or may not provide mechanical support and is a conductor to transfer signals between antenna 150 and electronic circuit 180. In some embodiments of the invention, four supports 130 are used to hold patch antenna 150 from four corners of patch antenna 150. Alternatively, more or less supports 130 may be used and their position on substrate 110 may vary depending among other things on the number of supports used.

In some embodiments of the invention, volume 165, which is bound by electronic circuit 180 from below and ground plate 140 from above, is injected with a filler material, for example an epoxy resin that is then cured to form a solid unified hybrid circuit 100 that will not readily collapse under external pressure. Optionally, an enclosure 170 which surrounds electronic circuit 180 is used to provide support in holding antenna 150 in place above electronic circuit 180 in addition to or instead of supports 130. In some embodiments of the invention, enclosure 170 is formed from a non-conductive material (e.g. a polymer, polytetrafluoroethylene (Teflon™) or ceramics). Alternatively, enclosure 170 is formed from a metal (e.g. aluminum) or a metal coated polymer.

Optionally, enclosure 170 provides electromagnetic shielding for circuit 100. In some embodiments of the invention, enclosure 170 completely encapsulates patch antenna 150 and electronic circuit 180 to form a monolithic package. The package may be filled with a filling material or not and the filling material may or may not be able to harden by curing. In some embodiments of the invention enclosure 170 does not entirely encapsulate circuit 100 and the filling material is cured to form a solid unit.

Figure 1B:
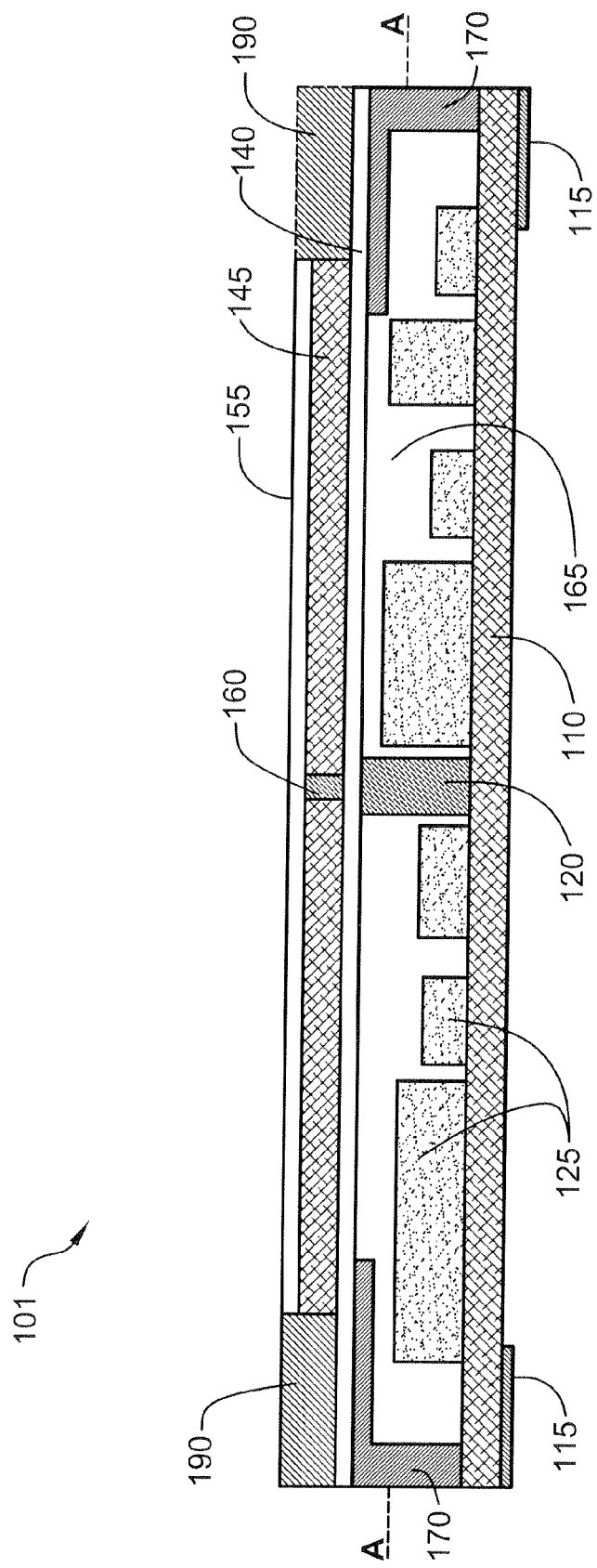
FIG. 1B is a schematic illustration of a cross sectional view of an alternative hybrid circuit with an electronic circuit and integral patch antenna, according to an exemplary embodiment of the invention.

FIG. 1B is a schematic illustration of a cross sectional view (AA) of an alternative hybrid circuit 101 with an integral patch antenna 150, according to an exemplary embodiment of the invention. In FIG. 1B enclosure 170 is shown to enclose electronic circuit 180 and support patch antenna 150. Optionally, volume 190 is filled with a curable filler material either during manufacture of patch antenna 150 or when coupling between electronic circuit 180 and patch antenna 150. Optionally, electronic circuit 180 and patch antenna 150 are coupled to form a monolithic package by curing the filling material or by applying an adhesive or other attaching devices, for example screws or staples.

In some embodiments of the invention, electronic circuit 180 with patch antenna 150 coupled to it is placed in a mold and a filling material is injected and cured to form a monolithic modular package with antenna 150 on top and substrate 110 on the bottom, with or without additional mechanical supports and/or enclosures. Some exemplary epoxy molding compounds, which can be used as filling materials are Hysol® GR9851M and Hysol® MG52F-99B from Henkel Technologies from New-York, Canada and Brazil.

Figure 2:
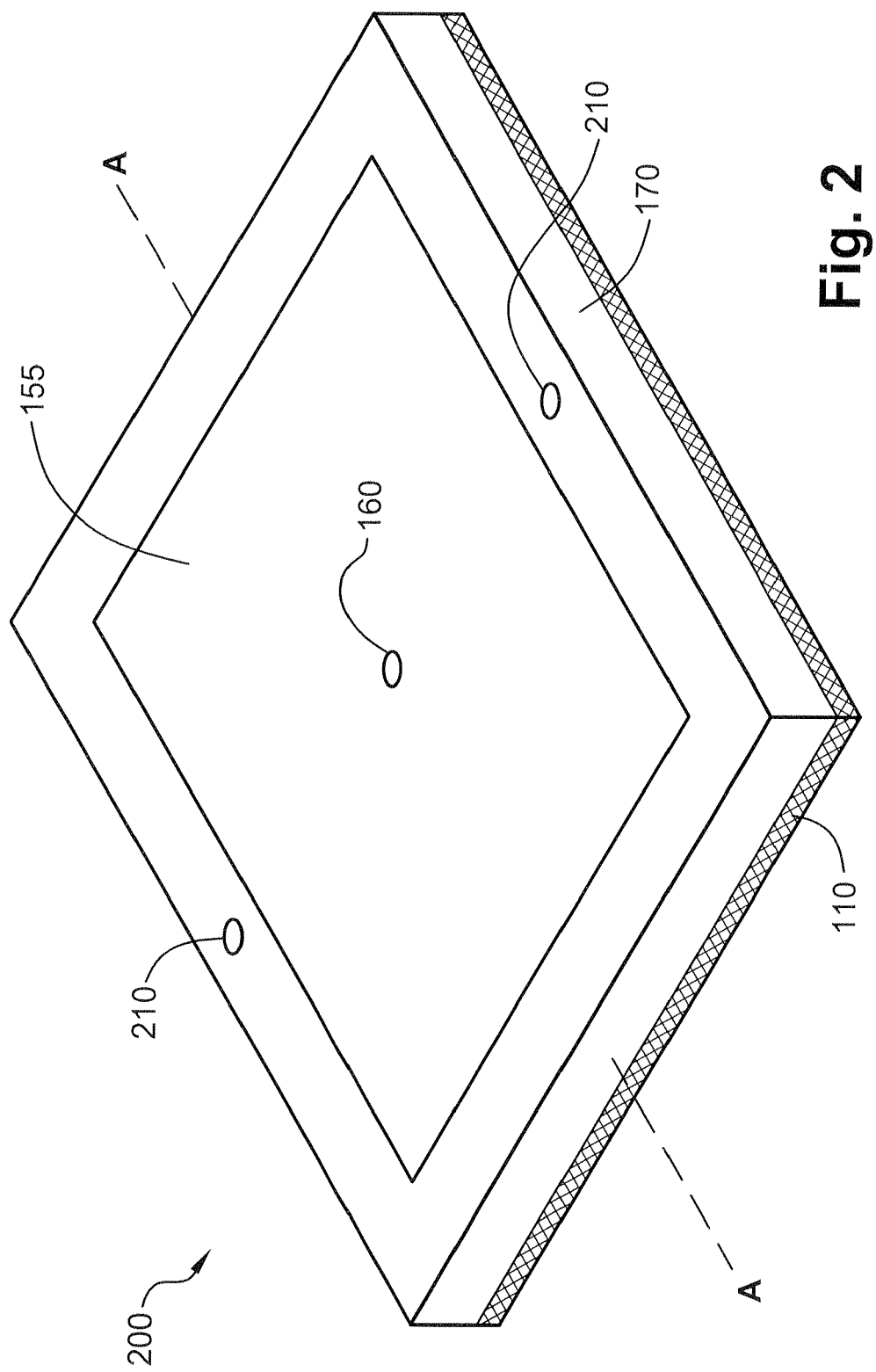
FIG. 2 is a schematic illustration of a top view of a packaged hybrid circuit with an integral patch antenna, according to an exemplary embodiment of the invention.

FIG. 2 is a schematic illustration of a top view of packaged hybrid circuit 200 with electronic circuit 180 and integral patch antenna 150, according to an exemplary embodiment of the invention. In an exemplary embodiment of the invention, packaged hybrid circuit 200 is provided as a monolithic rectangular shaped module bounded by substrate 110 from below, conductor patch 155 from above and encasement 170 from the sides. Alternatively any other shape can be used for packaged hybrid circuit 200. Optionally, the filling material filling volume 165 and/or 190 (as in FIG. 1B) contributes to the rigidness of the resulting monolithic package. In an exemplary embodiment of the invention, encasement 170 may completely cover conductor patch 155 to protect it from the environment for example from moisture. Alternatively, conductor patch 155 may remain uncovered to enhance its ability to transmit. In some embodiments of the invention, the monolithic package may be coated by coating materials to protect it from moisture or other environmental factors.

In an exemplary embodiment of the invention, integrating patch antenna 150 into hybrid circuit 100 provides the following benefits:

1. It reduces the distance between patch antenna 150 and electronic circuit 180 thereby improving the signal level and signal level to noise.

2. It reduces the number of amplification elements required, thus reducing the overall size of hybrid circuit 100.

3. The bottom of ground plate 140 serves as a shield for electronic circuit 180 to protect it from external noise and noise from conductor plate 155.

4. Hybrid circuit 100 simplifies construction of communication devices by providing a single circuit, which provides all functions of the device (including the antenna).

In some embodiments of the invention, encasement 170 comprises one or more holes 210 for injecting a filling material to fill in the volume left between patch antenna 150 and electronic circuit 180. Optionally, hybrid circuit 100 is cured with a heat process to solidify the filling material.

In some embodiments of the invention, encasement 170 as shown in FIGS. 1A, 1B and FIG. 2 is formed from the cured filling material and is not an additional material surrounding hybrid circuit 100.

Figure 3:
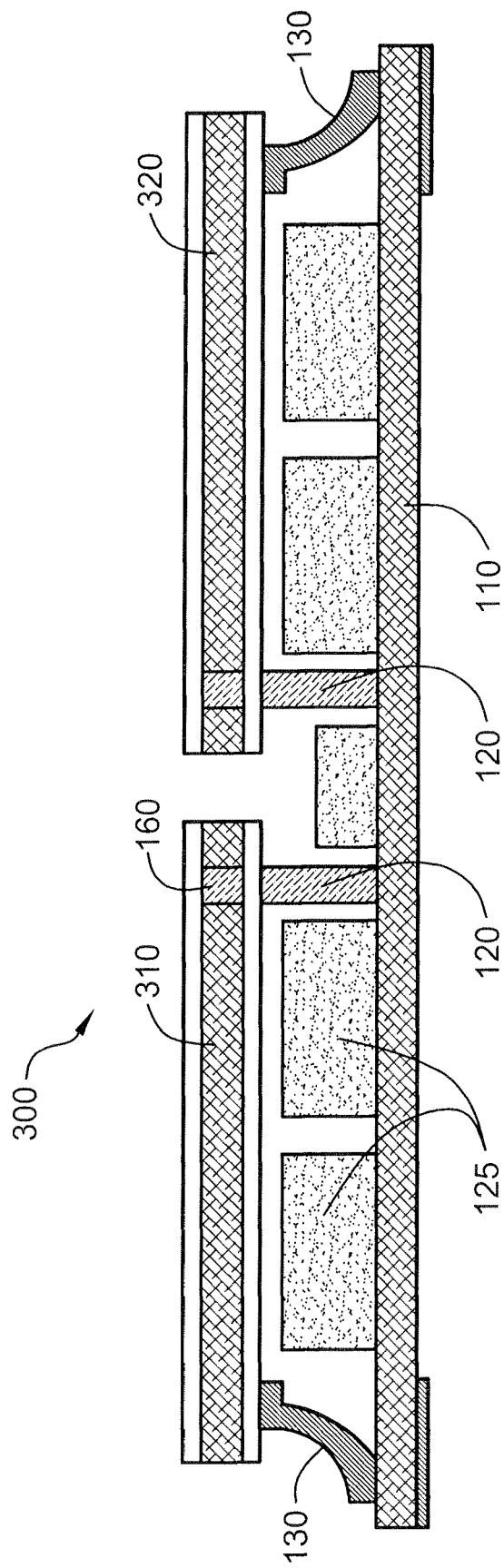
FIG. 3 is a schematic illustration of a cross sectional view of a hybrid circuit with two patch antennas, according to an exemplary embodiment of the invention.

FIG. 3 is a schematic illustration of a cross sectional view of a hybrid circuit 300 with two patch antennas (310, 320), according to an exemplary embodiment of the invention. In some embodiments of the invention, more than one antenna is positioned above electronic circuit 180 to provide communications for different applications, for example GPS and GPRS for a mobile telephone. Thus hybrid circuit 300 serves as a single element that provides functionality as a GPS device and a GPRS device. Optionally, hybrid circuit 300 is implemented as the same size as hybrid circuit 100 by reducing the size of each patch antenna. Alternatively, the encasement of hybrid circuit 300 is twice as large as hybrid circuit 100 to accommodate for extra circuit elements 125 and for two patch antennas 150.

It should be noted that the exact details of the circuit implementation described above are only exemplary and other variations may be implemented to provide other options, provide the same options in a different manner, or to remove some of the options.

It should be appreciated that the above described methods and apparatus may be varied in many ways, including omitting or adding steps, changing the order of steps and the type of devices used. It should be appreciated that different features may be combined in different ways. In particular, not all the features shown above in a particular embodiment are necessary in every embodiment of the invention. Further combinations of the above features are also considered to be within the scope of some embodiments of the invention.

It will be appreciated by persons skilled in the art that the present invention is not limited to what has been particularly shown and described hereinabove. Rather the scope of the present invention is defined only by the claims, which follow.

The invention claimed is:

1. A circuit with an integral antenna, comprising:
a hybrid circuit comprising multiple electrical elements on a substrate;
a patch antenna that is adapted to be positioned at a pre-selected distance above the hybrid circuit and coupled to the hybrid circuit to form a single physical unit; wherein said patch antenna comprises a conducting plate, a ground plate isolated from said conducting plate and a dielectric layer between the conducting plate and the ground plate; and wherein the elements of the hybrid circuit extend upward from the substrate toward the patch antenna;
a feeder that electronically connects between said hybrid circuit and the conducting plate of said patch antenna; wherein said feeder is provided as a via hole with a feed line that passes through the dielectric layer and the ground plate.

2. A circuit according to claim 1, wherein the footprint of said single physical unit is smaller than 100 mm by 100 mm and adapted to handle GPS signals.

3. A circuit according to claim 1, wherein the width and length of the footprint of said single physical unit are each at least twice the size of the thickness of said single physical unit.

4. A circuit according to claim 1, wherein the volume between the hybrid circuit and the patch antenna is filled with a filling material.

5. A circuit according to claim 4, wherein said filling material can be hardened by a curing process.

6. A circuit according to claim 5, wherein said filling material couples between the patch antenna and the hybrid circuit.

7. A circuit according to claim 5, wherein said filling material is applied in a mold to form a monolithic package for the single physical unit.

8. A circuit according to claim 1, wherein said hybrid circuit comprises one or more supports to couple between the hybrid circuit and the patch antenna.

9. A circuit according to claim 1, wherein said feeder couples between the hybrid circuit and the patch antenna.

10. A circuit according to claim 1, further comprising an encasement that defines said single physical unit.

11. A circuit according to claim 10, wherein said encasement couples between the hybrid circuit and the patch antenna.

12. A circuit according to claim 10, wherein said encasement comprises holes for injecting a filling material between the hybrid circuit and the patch antenna.

13. A circuit according to claim 1, wherein the top of said single physical unit is bound by said patch antenna.

14. A circuit according to claim 1, wherein the bottom of said single physical unit is bound by said substrate.

15. A circuit according to claim 1, wherein said pre-selected distance is not greater than 1 mm from the tallest element of the hybrid circuit.

16. A circuit according to claim 1, wherein said patch antenna is adapted to handle GPS signals.

17. A circuit according to claim 1, wherein multiple patch antennas are integrated into said circuit.

18. A circuit according to claim 17, wherein two patch antennas are integrated into said circuit.

19. A circuit according to claim 1, wherein said single physical unit is coated by a protective coating to protect it from environmental factors.

20. A method of creating a hybrid circuit with an integral antenna, comprising:
preparing a hybrid electronic circuit comprising multiple electrical elements on a substrate;
preparing a patch antenna for communicating with said hybrid electronic circuit; wherein said patch antenna comprises a conducting plate, a ground plate isolated from said conducting plate and a dielectric layer between the conducting plate and the ground plate; attaching said patch antenna above said hybrid electronic circuit; wherein the elements of the hybrid circuit extend upward from the substrate toward the patch antenna;
connecting a feeder that electronically connects between said hybrid circuit and the conducting plate of said patch antenna; wherein said feeder is provided as a via hole with a feed line that passes through the dielectric layer and the ground plate,
filling the volume between said patch antenna and said hybrid electronic circuit with a filling material to form a monolithic packaged hybrid circuit with an integral antenna.

* * * * *